US008279589B2

(12) United States Patent
Kim

(10) Patent No.: US 8,279,589 B2
(45) Date of Patent: Oct. 2, 2012

(54) APPARATUS AND METHOD FOR DATA ENTRY FROM A REMOVABLE PORTABLE DEVICE COVER

(76) Inventor: Christine Hana Kim, San Jose, CA (US)

( * ) Notice: Subject to any disclaimer, the term of this patent is extended or adjusted under 35 U.S.C. 154(b) by 131 days.

(21) Appl. No.: 12/698,136

(22) Filed: Feb. 1, 2010

(65) Prior Publication Data

US 2011/0188176 A1 Aug. 4, 2011

(51) Int. Cl.
*G06F 1/16* (2006.01)
*H05K 5/00* (2006.01)
*H05K 7/00* (2006.01)

(52) U.S. Cl. ......... 361/679.15; 361/679.09; 361/679.56; 455/575.8

(58) Field of Classification Search .. 361/679.08–679.2, 361/679.3, 679.55, 679.56; 455/575.1–575.4, 455/575.8
See application file for complete search history.

(56) References Cited

U.S. PATENT DOCUMENTS

| | | | |
|---|---|---|---|
| 4,324,976 A | 4/1982 | Lapeyre | |
| 4,718,550 A * | 1/1988 | Johnson | 206/387.13 |
| 4,855,725 A * | 8/1989 | Fernandez | 345/173 |
| 4,939,514 A * | 7/1990 | Miyazaki | 341/22 |
| 5,335,273 A * | 8/1994 | Takagi et al. | 379/433.13 |
| 5,712,760 A * | 1/1998 | Coulon et al. | 361/679.15 |
| 6,047,196 A * | 4/2000 | Makela et al. | 455/556.1 |
| 6,107,988 A * | 8/2000 | Phillipps | 345/156 |
| D435,550 S * | 12/2000 | Chu et al. | D14/345 |
| 6,168,331 B1 * | 1/2001 | Vann | 400/472 |
| 6,297,752 B1 * | 10/2001 | Ni | 341/22 |
| 6,327,482 B1 * | 12/2001 | Miyashita | 455/566 |
| 6,370,018 B1 * | 4/2002 | Miller et al. | 361/679.08 |
| 6,456,487 B1 * | 9/2002 | Hetterick | 361/679.3 |
| 6,568,574 B2 * | 5/2003 | Jones et al. | 224/222 |
| 6,580,932 B1 * | 6/2003 | Finke-Anlauff | 455/566 |
| 6,671,170 B2 * | 12/2003 | Webb et al. | 361/679.09 |
| 6,914,776 B2 * | 7/2005 | Kim | 361/679.11 |
| 6,999,804 B2 * | 2/2006 | Engstrom et al. | 455/575.3 |
| 7,032,825 B2 * | 4/2006 | Silverbrook | 235/472.01 |
| 7,054,146 B2 * | 5/2006 | Sutton et al. | 361/679.28 |
| 7,088,339 B2 * | 8/2006 | Gresham | 345/168 |
| 7,107,083 B2 * | 9/2006 | Watanabe | 455/575.3 |
| 7,128,269 B2 * | 10/2006 | Silverbrook | 235/462.45 |
| 7,393,151 B1 * | 7/2008 | Miller, Jr. | 400/682 |
| 7,400,496 B2 * | 7/2008 | Sauer et al. | 361/679.09 |
| 7,705,799 B2 * | 4/2010 | Niwa | 345/1.1 |
| D621,396 S * | 8/2010 | Lee et al. | D14/252 |
| 7,777,856 B2 * | 8/2010 | Silverbrook | 349/150 |
| 7,782,610 B2 * | 8/2010 | Diebel et al. | 361/679.56 |
| 7,912,522 B2 * | 3/2011 | Pierson | 455/575.3 |
| 7,965,495 B2 * | 6/2011 | Hendren et al. | 361/679.01 |

(Continued)

*Primary Examiner* — Adrian S Wilson
(74) *Attorney, Agent, or Firm* — Invent Capture, LLC; Samuel S. Cho

(57) ABSTRACT

One or more apparatuses and methods are disclosed for data entry from a removable portable device cover which are configured to cover, surround, and/or encapsulate at least a portion of an exterior shell of a portable electronic device. In one embodiment of the invention, a physical keyboard is operatively connected and/or attached to a removable portable device frame of the removable portable device cover, wherein the removable portable device frame is designed to fit a portable electronic device. In some embodiments of the invention, the operative connection and/or attachment of a physical keyboard to a removable portable frame may be accomplished by using straps, connector ports, and/or wireless protocols. Furthermore, a physical keyboard operatively connected and/or attached to the removable portable device frame may be a foldable physical keyboard which enables easy touch-typing for a user if the foldable physical keyboard is fully expanded.

15 Claims, 12 Drawing Sheets

U.S. PATENT DOCUMENTS

| | | | |
|---|---|---|---|
| 2001/0003707 A1* | 6/2001 | Moriya | 455/566 |
| 2002/0126440 A1* | 9/2002 | Webb et al. | 361/680 |
| 2003/0142469 A1* | 7/2003 | Ponx | 361/683 |
| 2003/0184958 A1* | 10/2003 | Kao | 361/683 |
| 2003/0202656 A1* | 10/2003 | Ikeuchi et al. | 379/419 |
| 2004/0094584 A1* | 5/2004 | Tabata | 224/221 |
| 2004/0097256 A1* | 5/2004 | Kujawski | 455/550.1 |
| 2005/0017953 A1* | 1/2005 | Pekka | 345/169 |
| 2006/0060485 A1* | 3/2006 | Picot et al. | 206/320 |
| 2006/0201978 A9* | 9/2006 | Nichols | 224/222 |
| 2006/0211458 A1* | 9/2006 | Pletikosa | 455/575.3 |
| 2006/0256960 A1* | 11/2006 | Bae et al. | 379/433.11 |
| 2007/0045373 A1* | 3/2007 | Stewart, Sr. | 224/674 |
| 2007/0247793 A1* | 10/2007 | Carnevali | 361/681 |
| 2007/0268261 A1 | 11/2007 | Lipson | |
| 2008/0053770 A1* | 3/2008 | Tynyk | 190/100 |
| 2008/0096620 A1* | 4/2008 | Lee et al. | 455/575.8 |
| 2009/0039121 A1* | 2/2009 | Paul | 224/222 |
| 2009/0054114 A1* | 2/2009 | Ozawa | 455/575.4 |
| 2009/0061956 A1* | 3/2009 | Matsuoka | 455/575.1 |
| 2009/0111543 A1* | 4/2009 | Tai et al. | 455/575.8 |
| 2009/0114556 A1* | 5/2009 | Tai et al. | 206/320 |
| 2009/0170566 A1 | 7/2009 | Kwon et al. | |
| 2009/0286575 A1* | 11/2009 | Taniguchi et al. | 455/566 |
| 2009/0312058 A9* | 12/2009 | Wood et al. | 455/566 |
| 2011/0034219 A1* | 2/2011 | Filson et al. | 455/575.1 |

* cited by examiner

800

900

APPARATUS AND METHOD FOR DATA ENTRY FROM A REMOVABLE PORTABLE DEVICE COVER

BACKGROUND OF THE INVENTION

The present invention generally relates to a portable electronic device. More specifically, the present invention relates to an apparatus and a method for data entry from a removable portable device cover which may at least partially cover, encapsulate, and/or surround a separate portable electronic device.

Numerous portable electronic devices such as cellular phones, portable multimedia players, and navigation systems increasingly utilize touch-screen virtual keyboards for text and other data entry. For example, some popular "smartphone" devices predominantly reply on relatively large touch-screen surfaces which are configured to show virtual keyboards or virtual keypads for data entry. These smartphone devices sometimes entirely omit physical keyboards or physical keypads. Similarly, many portable GPS navigation systems and multimedia (e.g. music, video, etc.) players also do not have physical keyboards or physical keypads and rely on touch-screen-based virtual keyboards or virtual keypads instead.

Although the use of virtual keyboards or virtual keypads in these portable electronic devices may exhibit some advantages, such as lower cost of device production and clean-look design factor, some users still strongly prefer using a physical keyboard or a physical keypad which are typically made of plastic and/or rubber materials. It may not be economically advantageous for portable electronic device manufacturers to provide a physical keyboard or a physical keypad as part of a standard factory-spec feature for portable electronic devices that are designed to use a touch-screen virtual keyboard or a virtual keypad in the first place, because the integration costs and the margin pressures may increase significantly merely to provide a redundant method of data entry. Furthermore, even in portable electronic devices which integrate physical keyboards on their surfaces, there may be some dimensional limitations to make keyboards large enough to provide sufficient typing convenience to users.

Therefore, a physical keyboard or a physical keypad can become a popular aftermarket and/or optional accessory item to a portable electronic device, especially among users who prefer physical keyboards or physical keypads over touch-screen virtual counterparts. In addition, even in a portable device which incorporates a physical keyboard or a physical keypad on one of its surfaces, a more comfortable and ergonomic keyboard which can be conveniently carried with the portable device may be highly desirable. Therefore, a novel apparatus and a method for data entry from an accessory item to a portable electronic device may be highly beneficial to users.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, an apparatus for data entry from a removable portable device cover is disclosed. This apparatus comprises a removable cover frame configured to cover, surround, and/or encapsulate at least a portion of an exterior shell of a portable electronic device; a physical keyboard operatively connected to the removable cover frame via a cover-to-keyboard strap; a first detachable strap attached to the physical keyboard; and a second detachable strap attached to the removable cover frame, wherein the first detachable strap and the second detachable strap are configured to provide a detachable adhesion upon contact and wherein the detachable adhesion enables the physical keyboard to be positioned firmly on a rear surface of the removable portable device cover.

In another embodiment of the invention, another apparatus for data entry from a removable portable device cover is also disclosed. This apparatus comprises a removable cover frame configured to cover, surround, and/or encapsulate at least a portion of an exterior shell of a portable electronic device; and a physical keyboard and a text/graphic readout display located on a rear surface of the removable cover frame.

Yet in another embodiment of the invention, another apparatus for data entry from a removable portable device cover is also disclosed. This apparatus comprises a removable cover frame configured to cover, surround, and/or encapsulate at least a portion of an exterior shell of a portable electronic device; and a physical keyboard and a text/graphic readout display operatively connected to the removable cover frame via a keyboard/display connector port or strap, wherein the physical keyboard and the text/graphic readout display are configured to separate from the keyboard/display connector port or strap located on the removable cover frame.

Yet in another embodiment of the invention, another apparatus for data entry from a removable portable device cover is also disclosed. This apparatus comprises a removable cover frame configured to cover, surround, and/or encapsulate at least a portion of an exterior shell of a portable electronic device; and a foldable physical keyboard operatively connected to the removable cover frame, wherein the foldable physical keyboard comprises two or more pieces of keyboard elements which are fully expandable for easy touch-typing, and wherein the foldable physical keyboard is configured to cover at least a portion of the removable cover frame if the foldable physical keyboard is completely folded.

DETAILED DESCRIPTION

Figure 1:
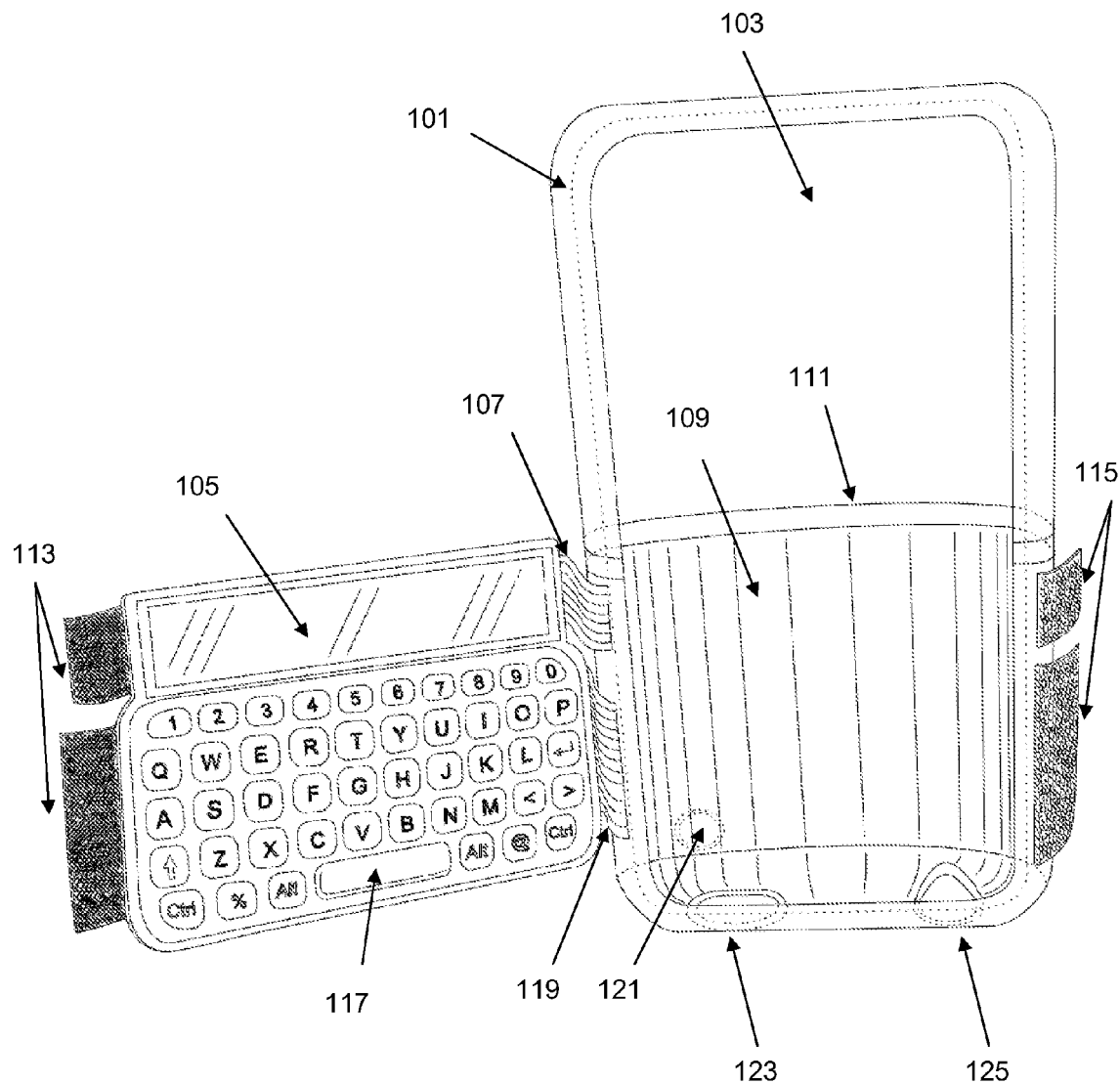
FIG. 1 shows a front surface of a removable portable device cover with a physical keyboard and a text/graphic readout display unit folded out sideways with detachable straps, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble one or more apparatuses and methods for data entry from a removable portable device cover which at least partially surrounds and/or encapsulates a separate portable electronic device. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order and do not imply any limitations in the invention.

One objective of the present invention is to provide a novel apparatus and a method for entering texts from a removable portable device cover, wherein the removable portable device cover is typically an aftermarket skin cover for at least a portion of an outer shell of a portable electronic device. Another objective of the invention is to provide a physical keyboard and/or a physical keypad attached to a removable portable device cover, wherein the physical keyboard and/or the physical keypad may be used in a "fold-out" position and/or a "strapped-on" position to a rear surface of the removable portable device cover. Yet another objective of the invention is to provide an optional text/graphic readout display unit which may be placed in a "fold-out" position and/or a "strapped-on" position along with the physical keyboard and/or the physical keypad of a removable portable device cover. Moreover, another objective of the invention is to provide a foldable physical keyboard operatively attached to a removable cover frame of a removable portable device cover, wherein the foldable physical keyboard enables portable touch-typing when the foldable physical keyboard is positioned in a fully expanded position.

For the purpose of describing the invention, a term "readout display" is defined as a display unit on a removable portable device cover which is capable of portraying at least some texts and/or graphics related to a user's data entry.

Furthermore, for the purpose of describing the invention, a term "removable portable device cover" is defined as a separate (i.e. typically aftermarket) skin covering of an outer shell of a portable electronic device. In a preferred embodiment of the invention, a removable portable device cover can surround and/or encapsulate a large portion of a portable electronic device. In another embodiment of the invention, a removable portable device cover can surround and/or encapsulate only a small portion of a portable electronic device. A removable portable device cover can be easily detached or attached to an outer shell of a portable electronic device. Furthermore, in a preferred embodiment of the invention, a removable portable device cover may be custom-fit and/or custom-made for a particular dimension for a particular portable electronic device. In another embodiment of the invention, a general-purpose or a standard-size removable portable device cover may fit a multiple number of portable electronic devices.

Moreover, for the purpose of describing the invention, a term "detachable strap" is defined as a strap which can be repeatedly attached and detached to another surface. In a preferred embodiment of the invention, a detachable strap may be a female Velcro strip or a male Velcro strip configured to be attached to and detached from another Velcro strip.

In addition, for the purpose of describing the invention, a term "physical keyboard" is defined as a keyboard and/or a keypad which has one or more tangible keys which can be touched and/or pressed to enter certain information (e.g. textual, symbolic, graphical) into an electronic device. Furthermore, the term "physical keyboard" can also imply a keyboard and/or a keypad configuration with a joystick, a pointer-stick, a track-ball, an embedded mouse, and/or any other user input devices which may be used in combination with the one or more tangible keys. One example of a physical keyboard according to the term definition herein has one or more hardware switches corresponding to plastic-cap keys above for text and other data entry by a user. This type of a physical keyboard is commonly found in desktop/laptop keyboards and some other electronic devices for data entry. Another example of a physical keyboard according to the term definition herein is a flat-surface keyboard (e.g. a keyboard drawn on a thin piece of plastic, glass, paper, and/or other materials) which has predefined physical areas for typing characters and other symbols. The flat-surface keyboard may be touch-sensitive and/or pressure-sensitive.

FIG. 1 shows a front surface of a removable portable device cover (100) with a physical keyboard (117) and a text/graphic readout display unit (105) folded out sideways with first one or more detachable straps (113), in accordance with an embodiment of the invention. In a preferred embodiment of the invention, a physical keyboard (117) is operatively attached to a portion of a removable cover frame (101) via a cover-to-keyboard strap (119). Optionally, a text/graphics readout display unit (105) is also operatively attached to a portion of the removable cover frame (101) via a cover-to-display strap (107). In the preferred embodiment of the invention, the cover-to-display strap (107) and/or the cover-to-keyboard strap (119) may contain electrical and/or optical connections to the text/graphics readout display unit (105) and/or the physical keyboard (117).

Figure 3:
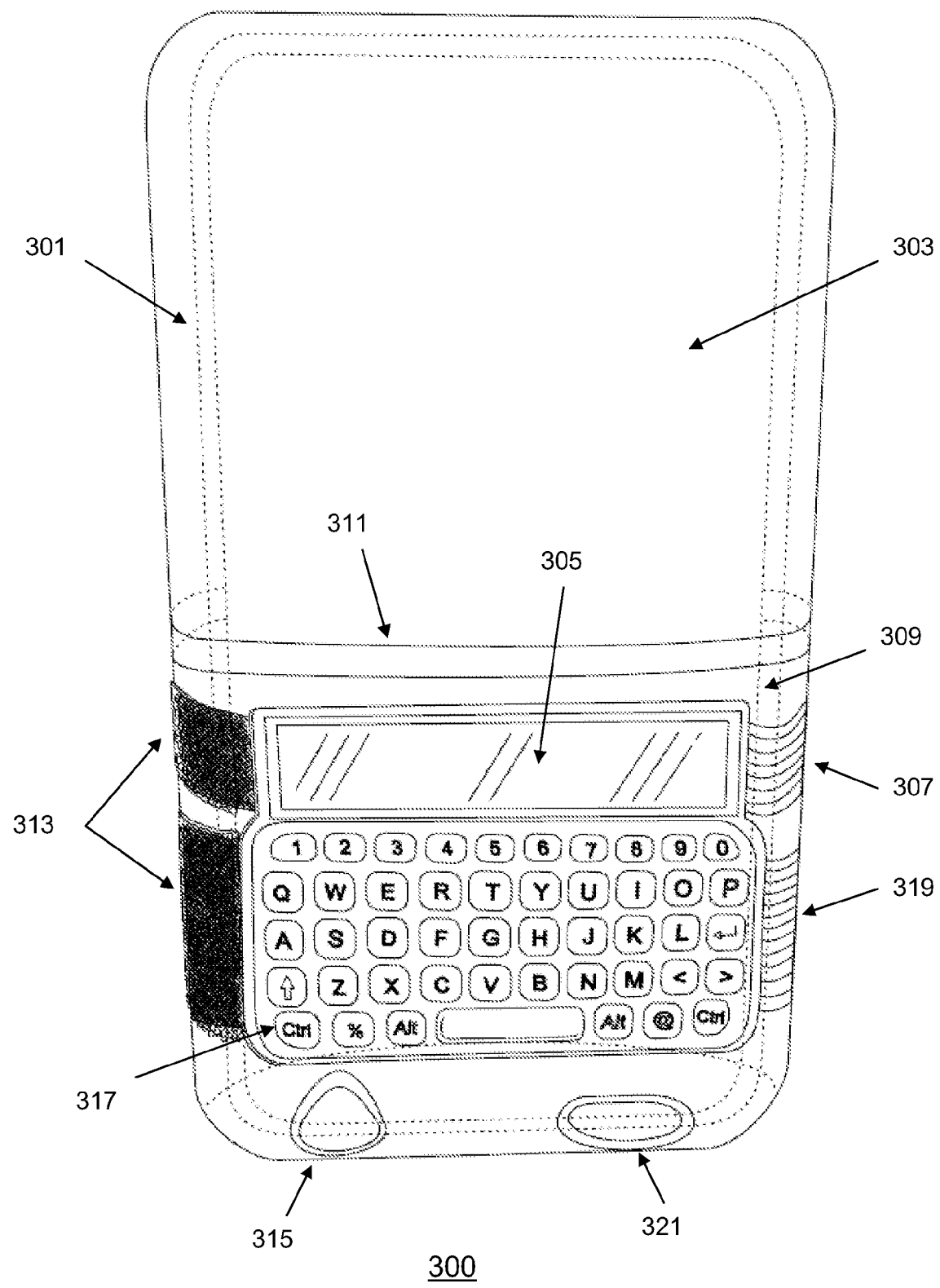
FIG. 3 shows a rear surface of a removable portable device cover with a physical keyboard and a text/graphic readout display unit attached to the rear surface of the removable portable device cover with detachable straps, in accordance with an embodiment of the invention.

Furthermore, in one embodiment of the invention, the first one or more detachable straps (113) can be attached or detached to second one or more detachable straps (115), if the physical keyboard (117) and/or the text/graphic readout display unit (105) are "swung back" to a "strapped-on" position as shown in FIG. 3. In a preferred embodiment of the invention, the first one or more detachable straps (113) and the second one or more detachable straps (115) are Velcro strips of opposite gender to accommodate repetitive attachment and detachment of both detachable straps (113, 115). In addition, in one embodiment of the invention, the physical keyboard (117) and/or the text/graphic readout display unit (105) can be separately powered by a battery or another power source independent of a portable electronic device which is designed to fit into the removable portable device cover (100). In another embodiment of the invention, the physical keyboard (117) and/or the text/graphic readout display unit (105) may be powered by the portable electronic device through an electrical connection.

In a "fold-out" position as shown in FIG. 1, a user can type on the physical keyboard (117) and check at least some textual and/or graphical information relevant to his/her data entry on the text/graphics readout display unit (105), regardless of a current state or a current position of a device display on a portable electronic device. In the "fold-out" position, the user may also utilize a main device display on a front surface of a portable electronic device as well as the text/graphics readout display unit (105) on the removable portable device cover (100) for a dual-display use. A user may find typing in the "fold-out" position particularly convenient if a task requires watching the main device display on the front surface of a portable electronic device as he/she types on the physical keyboard (117) attached to a removable portable device cover (100). In the "fold-out" position, the user may get an additional benefit of checking for any typos on a separate text/graphic readout display (105) attached to the removable portable device cover (100) even as he/she also watches the main device display of the portable electronic device.

Moreover, the physical keyboard (117) and/or the text/graphic readout display unit (105) are configured to share (i.e. transmit and/or receive) at least some textual information with the portable electronic device designed to fit into the removable portable device cover (100). In a preferred embodiment of the invention, textual information can be shared among the physical keyboard (117), the text/graphic readout display unit (105), and the portable electronic device using electrical wire connections. In another embodiment of the invention, the textual information can be shared among the physical keyboard (117), the text/graphic readout display unit (105), and the portable electronic device using purely wireless protocols such as Bluetooth. Yet in another embodiment of the invention, the textual information can be shared among the physical keyboard (117), the text/graphic readout display unit (105), and the portable electronic device by using a combination of wired and wireless methods well known in the art.

Continuing with FIG. 1, in one embodiment of the invention, the removable portable device cover (100) has a removable cover frame (101) which accommodates a rear wall (109), a rear wall band (111), and a plurality of auxiliary connection openings such as a camera lens hole (121), a first cover opening for external connection (123), and a second cover opening for external connection (125). Examples of external connections through cover openings include data and/or power outlet connections for a portable device designed to be placed inside the removable portable device cover. Furthermore, an optional extension of the rear wall (103) or an optional open rear space (103) may be placed above the rear wall band (111) in some embodiments of the invention. Although the rear wall (109), the rear wall band (111), and the plurality of auxiliary connection openings may be desired in some embodiments, incorporations of these particular elements are merely optional for the present invention. In certain cases, the rear wall (109) may be utilized to provide a structural rigidity to the physical keyboard (117) in a "strapped-on" position as shown in FIG. 3.

Figure 2:
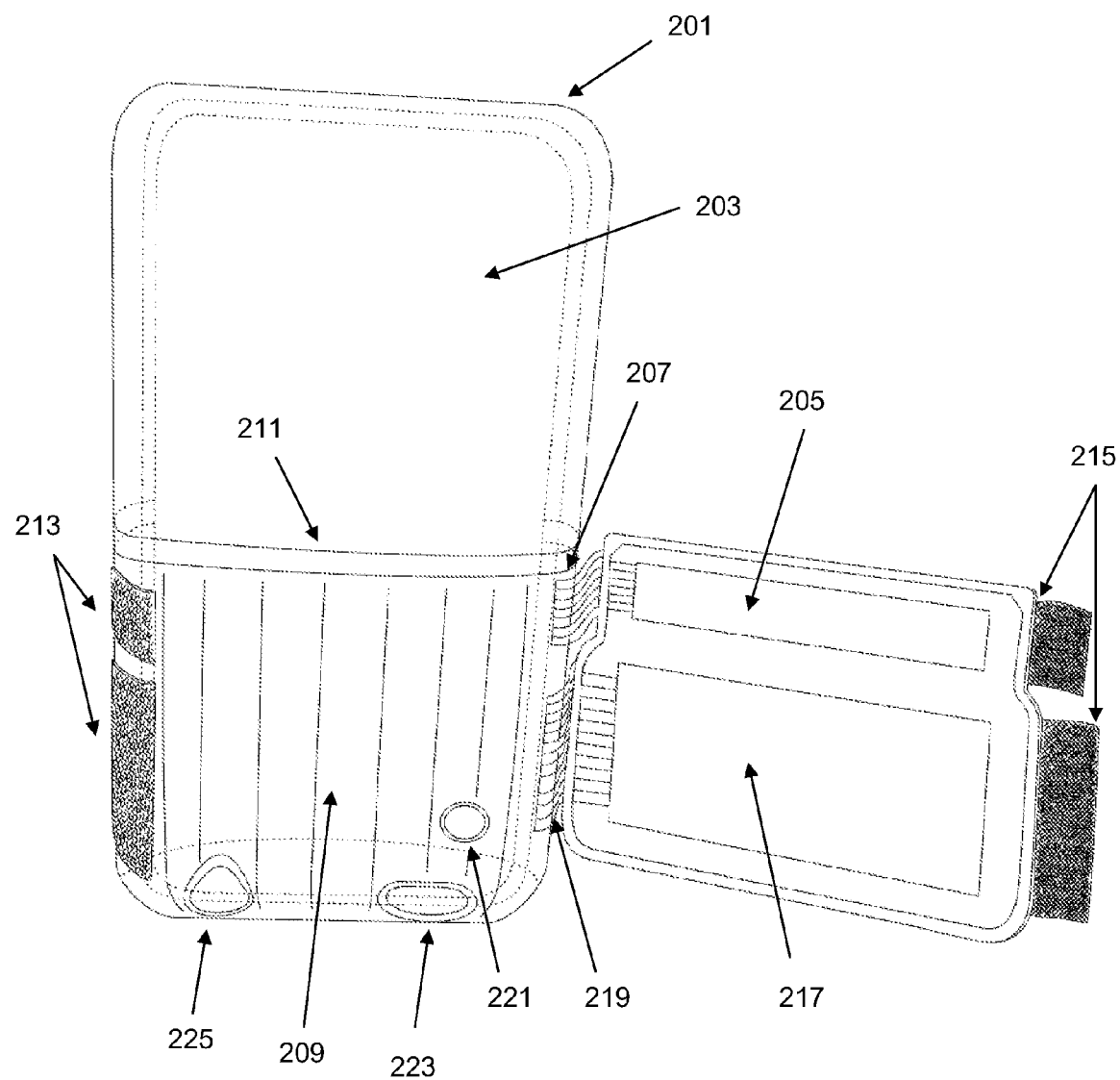
FIG. 2 shows a rear surface of a removable portable device cover with a physical keyboard and a text/graphic readout display unit folded out sideways with detachable straps, in accordance with an embodiment of the invention.

FIG. 2 shows a rear surface of a removable portable device cover (200) with a rear panel of a physical keyboard (217) and a rear panel of a text/graphic readout display unit (205) folded out sideways with first one or more detachable straps (215), in accordance with an embodiment of the invention. In a preferred embodiment of the invention, a rear panel of a physical keyboard (217) is operatively attached to a portion of a removable cover frame (201) via a cover-to-keyboard strap (219). Optionally, a rear panel of a text/graphics readout display unit (205) is also operatively attached to a portion of the removable cover frame (201) via a cover-to-display strap (207). In the preferred embodiment of the invention, the cover-to-display strap (207) and/or the cover-to-keyboard strap (219) may contain electrical and/or optical connections to the rear panel of the text/graphics readout display unit (205) and/or the rear panel of the physical keyboard (217).

Furthermore, in one embodiment of the invention, the first one or more detachable straps (215) can be attached or detached to second one or more detachable straps (213), if the rear panel of the physical keyboard (217) and/or the rear panel of the text/graphic readout display unit (205) are "swung back" to a "strapped-on" position as shown in FIG. 3. In a preferred embodiment of the invention, the first one or more detachable straps (215) and the second one or more detachable straps (213) are Velcro strips of opposite gender to accommodate repetitive attachment and detachment of both detachable straps (215, 213). In addition, in one embodiment of the invention, the physical keyboard (e.g. 117) and/or the text/graphic readout display unit (e.g. 105) can be separately powered by a battery or another power source independent of a portable electronic device which is designed to fit into the removable portable device cover (200). In another embodiment of the invention, the physical keyboard (e.g. 117) and/or the text/graphic readout display unit (e.g. 105) may be powered by the portable electronic device through an electrical connection.

Moreover, the physical keyboard (e.g. 117) and/or the text/graphic readout display unit (e.g. 105) are configured to share (i.e. transmit and/or receive) at least some textual information with the portable electronic device designed to fit into the removable portable device cover (200). In a preferred embodiment of the invention, textual information can be shared among the physical keyboard (e.g. 117), the text/graphic readout display unit (e.g. 105), and the portable electronic device using electrical wire connections. In another embodiment of the invention, the textual information can be shared among the physical keyboard (e.g. 117), the text/graphic readout display unit (e.g. 105), and the portable electronic device using purely wireless protocols such as Bluetooth. Yet in another embodiment of the invention, the textual information can be shared among the physical keyboard (e.g. 117), the text/graphic readout display unit (e.g. 105), and the portable electronic device by using a combination of wired and wireless methods well known in the art.

Continuing with FIG. 2, in one embodiment of the invention, the removable portable device cover (200) has a removable cover frame (201) which accommodates a rear wall (209), a rear wall band (211), and a plurality of auxiliary connection openings such as a camera lens hole (221), a first cover opening for external connection (223), and a second cover opening for external connection (225). Examples of external connections through cover openings include data and/or power outlet connections for a portable device designed to be placed inside the removable portable device cover. Furthermore, an optional extension of the rear wall (203) or an optional open rear space (203) may be placed above the rear wall band (211) in some embodiments of the invention. Although the rear wall (209), the rear wall band (211), and the plurality of auxiliary connection openings may be desired in some embodiments, incorporations of these particular elements are merely optional for the present invention. In certain cases, the rear wall (209) may be utilized to provide a structural rigidity to the rear panel of the physical keyboard (217) in a "strapped-on" position as shown in FIG. 3.

FIG. 3 shows a rear surface of a removable portable device cover (300) with a physical keyboard (317) and a text/graphic readout display unit (305) attached to a rear wall (309) of the removable portable device cover (300) with detachable straps (313) in a "strapped-on" position, in accordance with an embodiment of the invention. In the "strapped-on" position as shown in FIG. 3, the physical keyboard (317) and the text/graphic readout display unit (305) are strapped to the rear wall (309) by overlapping at least some portions of first one or more detachable straps (e.g. 215) with second one or more detachable straps (e.g. 213). In a preferred embodiment of the invention, the detachable straps (313) are Velcro strips of opposite gender, which enable repetitive attachment and detachment of the first one or more detachable straps (e.g. 215) and the second one or more detachable straps (e.g. 213). A cover-to-display strap (307) and/or a cover-to-keyboard strap (319) may contain electrical and/or optical connections to the text/graphics readout display unit (305) and/or the physical keyboard (317).

Figure 8:
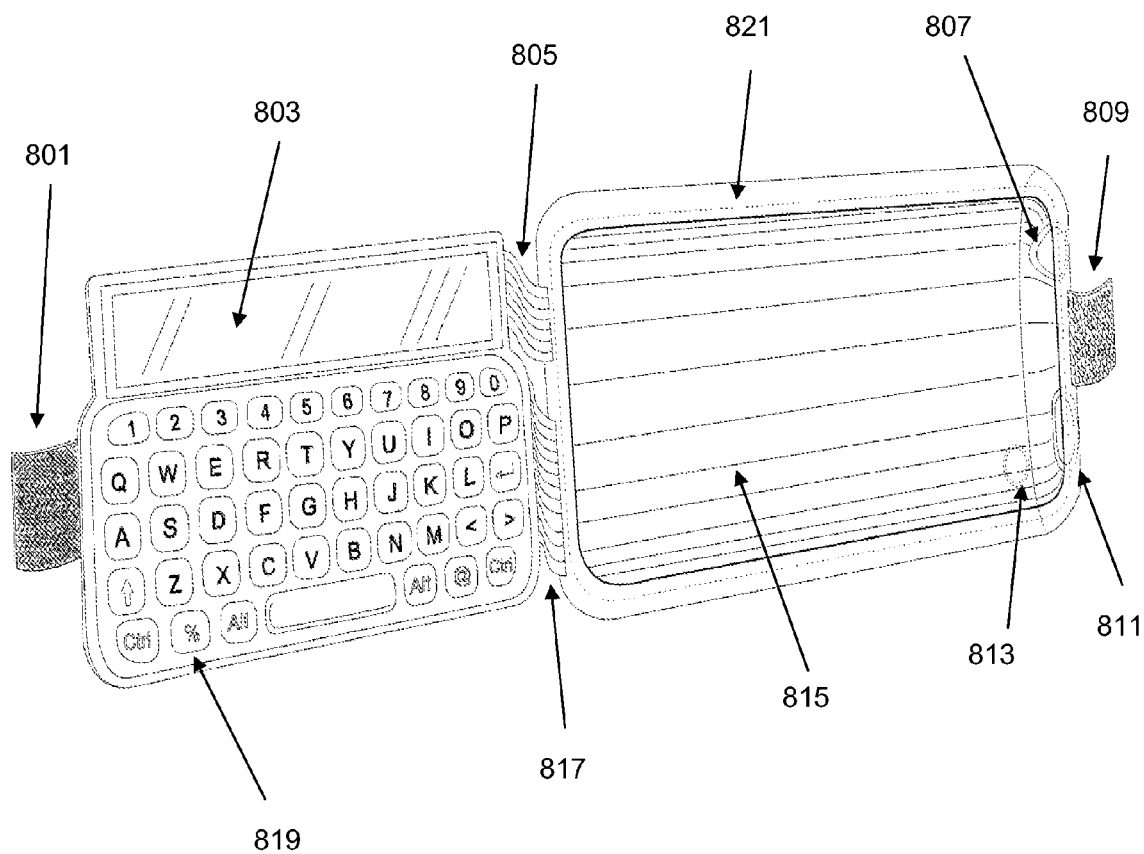
FIG. 8 shows a front surface of a removable portable device cover with a physical keyboard and a text/graphic readout display unit folded out from a top portion or a bottom portion of the removable portable electronics cover with detachable straps, in accordance with an embodiment of the invention.
Figure 9:
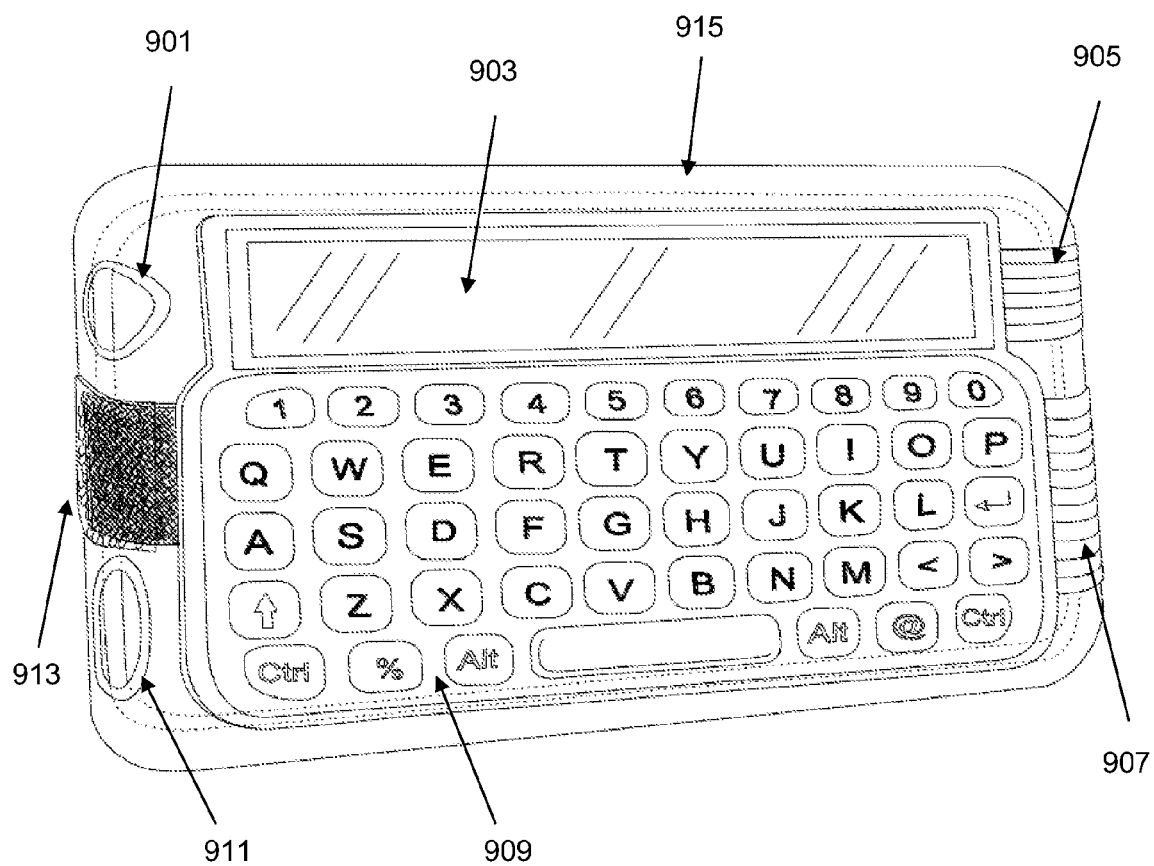
FIG. 9 shows a rear surface of a removable portable device cover with a physical keyboard and a text/graphic readout display unit attached to a rear wall of the removable portable device cover with detachable straps in a "strapped-on" position, in accordance with an embodiment of the invention.

In the "strapped-on" position as shown in FIG. 3, a user can type on the physical keyboard (317) and check at least some textual and/or graphical information relevant to his/her data entry on the text/graphics readout display unit (305), regardless of a current state or a current position of a device display on a portable electronic device. A user may find typing in the "strapped-on" position particularly convenient if a significant amount of typing is desired on a physical keyboard. Furthermore, the user also may find typing in the "strapped-on" position more convenient because of a larger-size keyboard on a rear surface of an aftermarket device cover as a substitute for a typically-cramped keyboard on a front surface of a portable device itself. It should be noted that the size of a keyboard on a removable portable electronic device cover embodied by the present invention can be even larger if a "landscape" orientation is utilized, as shown in FIGS. 8~9.

Continuing with FIG. 3, the physical keyboard (317) and/or the text/graphic readout display unit (305) are configured to share (i.e. transmit and/or receive) at least some textual information with the portable electronic device designed to fit into the removable portable device cover (300). In a preferred embodiment of the invention, textual information can be shared among the physical keyboard (317), the text/graphic readout display unit (305), and the portable electronic device using electrical wire connections. In another embodiment of the invention, the textual information can be shared among the physical keyboard (317), the text/graphic readout display unit (305), and the portable electronic device using purely wireless protocols such as Bluetooth. Yet in another embodiment of the invention, the textual information can be shared among the physical keyboard (317), the text/graphic readout display unit (305), and the portable electronic device by using a combination of wired and wireless methods well known in the art.

Continuing with FIG. 3, in one embodiment of the invention, the removable portable device cover (300) has a removable cover frame (301) which accommodates a rear wall (309), a rear wall band (311), a first cover opening for external connection (321), and a second cover opening for external connection (315). Examples of external connections through cover openings include data and/or power outlet connections for a portable device designed to be placed inside the removable portable device cover. Furthermore, an optional extension (303) of the rear wall or an optional open rear space (303) may be placed above the rear wall band (311) in some embodiments of the invention. Although the rear wall (309), the rear wall band (311), and a plurality of auxiliary connection openings (e.g. 315, 321) may be desired in some embodiments, incorporations of these particular elements are merely optional for the present invention. In certain cases, the rear wall (309) may be utilized to provide a structural rigidity to the rear panel of the physical keyboard (317) in a "strapped-on" position as shown in FIG. 3.

Figure 4:
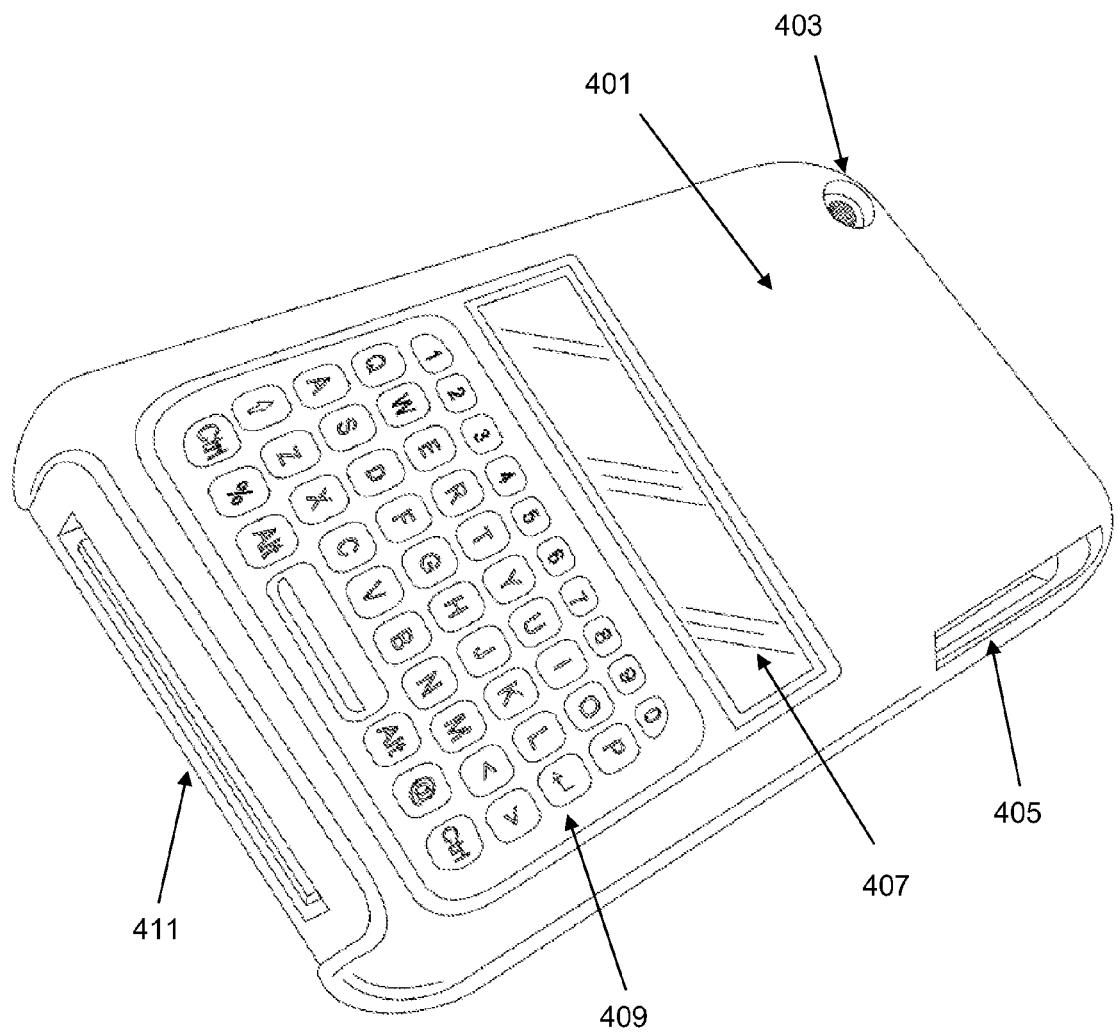
FIG. 4 shows a rear surface of a removable portable device cover with a physical keyboard and a text/graphic readout display unit embedded in the rear surface of the removable portable device cover, in accordance with an embodiment of the invention.

FIG. 4 shows a rear surface of a removable portable device cover (400) with a physical keyboard (409) and a text/graphic readout display unit (407) embedded in the rear surface of the removable portable device cover (400), in accordance with an embodiment of the invention. In this embodiment of the invention, the physical keyboard (409) and the text/graphic readout display unit (407) are positioned in a removable cover frame (401) of the removable portable device cover (400). In one example of this embodiment, the physical keyboard (409) and the text/graphic readout display unit (407) may be popped out of its embedded position for wireless data entry, which can be further communicated wirelessly with a portable device covered or encapsulated by the removable portable device cover (400). In another example of this embodiment, the physical keyboard (409) and the text/graphic readout display unit (407) may be permanently embedded in the removable cover frame (401).

Furthermore, in an embodiment of the invention as shown in FIG. 4, a plurality of auxiliary connection openings such as a first cover opening for external connection (405), a second cover opening for external connection (411), and a camera lens hole (403) can be incorporated on a surface of a removable cover frame (401). Examples of external connections through cover openings include data and/or power outlet connections for a portable device designed to be placed inside the removable portable device cover.

Figure 5:
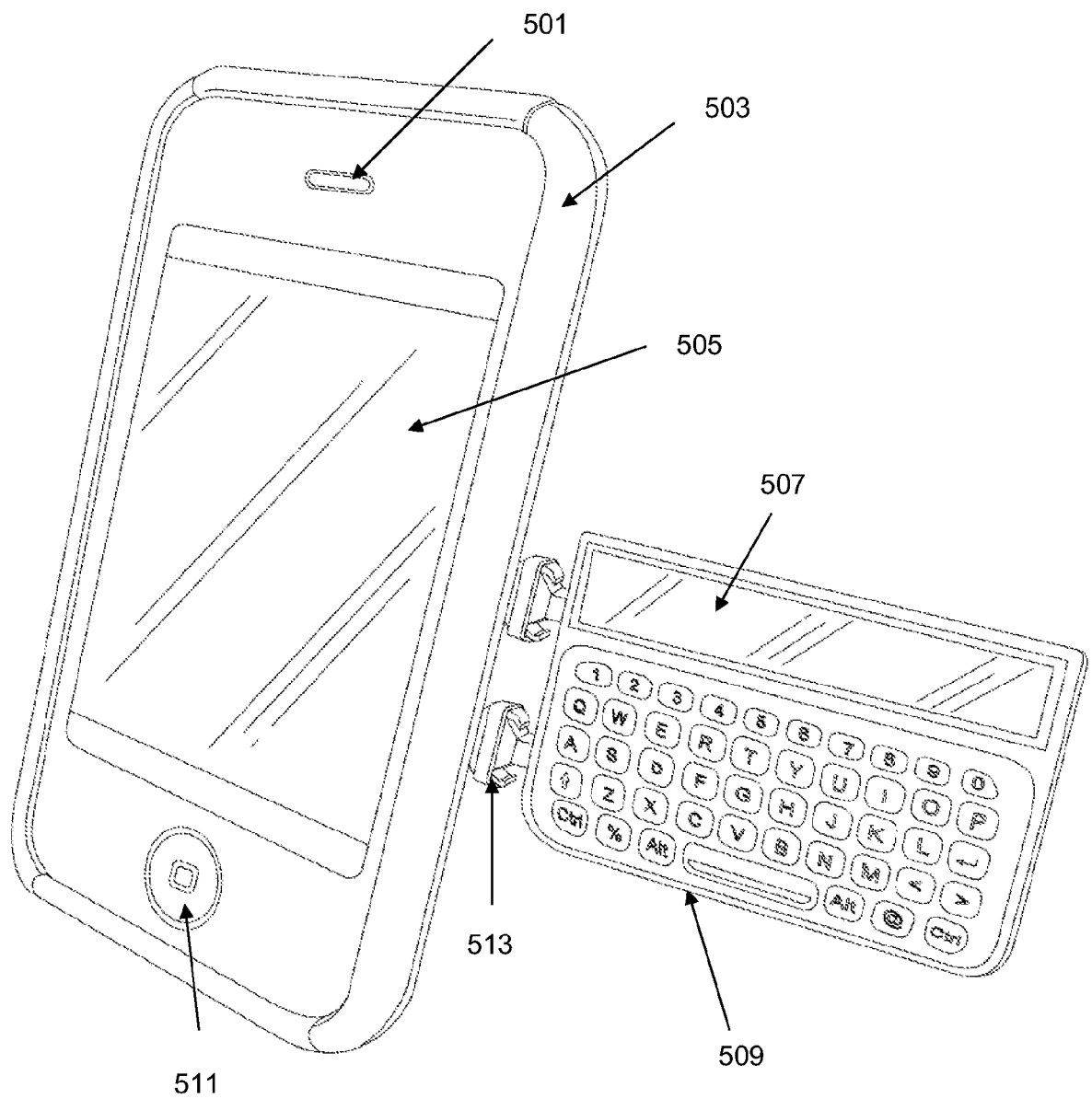
FIG. 5 shows a front surface of a removable portable electronics cover with a physical keyboard and a text/graphic readout display unit operatively connected to the removable portable electronics cover with a keyboard/display connector port, in accordance with an embodiment of the invention.

FIG. 5 shows a front surface of a removable portable electronics cover (500) with a physical keyboard (509) and a text/graphic readout display unit (507) operatively connected to the removable portable electronics cover (500) with a keyboard/display connector port (513), in accordance with an embodiment of the invention. This embodiment of the invention shows a removable cover frame (503) surrounding, encapsulating, and/or covering a portion of an outer shell of a portable electronic device. The removable cover frame (503) is typically an aftermarket skin cover for an outer shell of a portable electronic device, wherein the removable cover frame (503) also incorporates a separate physical keyboard (509) and a text/graphic readout display unit (507), regardless of what portable electronic device the removable cover frame (503) at least partially surrounds, encapsulates, and/or covers. Furthermore, in one embodiment of the invention, a portable device at least partially surrounded, encapsulated, and/or covered by the removable cover frame (503) has an earpiece (501), a touch-screen interface (505), and a hardware-based button (511) which are exposed to an exterior shell of the portable device.

In one example of an embodiment as shown by FIG. 5, the keyboard/display connector port (513) enables a physical docking and a separation of a physical keyboard (509) and/or a text/graphic readout display unit (507). When the physical keyboard (509) and/or the text graphic readout display unit (507) are docked to the keyboard/display connector port (513), the removable cover frame (503) and/or a portable electronic device inside the removable cover frame (503) may be able to recharge a battery contained by the physical keyboard (509) and/or the text/graphic readout display unit (507). Furthermore, the physical keyboard (509) and the text/graphic readout display unit (507) docked to the keyboard/display connector port (513) may still enable data entry operations to a user either via a wired or a wireless communication with a portable electronic device at least partially surrounded, encapsulated, and/or covered by the removable cover frame (503), even as the battery contained by the physical keyboard (509) and/or the text/graphic readout display unit (507) is charging. In a preferred embodiment of the invention, the text/graphic readout display unit (507) is capable of displaying at least some visual information to allow a user to see what he/she is typing into the physical keyboard (509).

Figure 6:
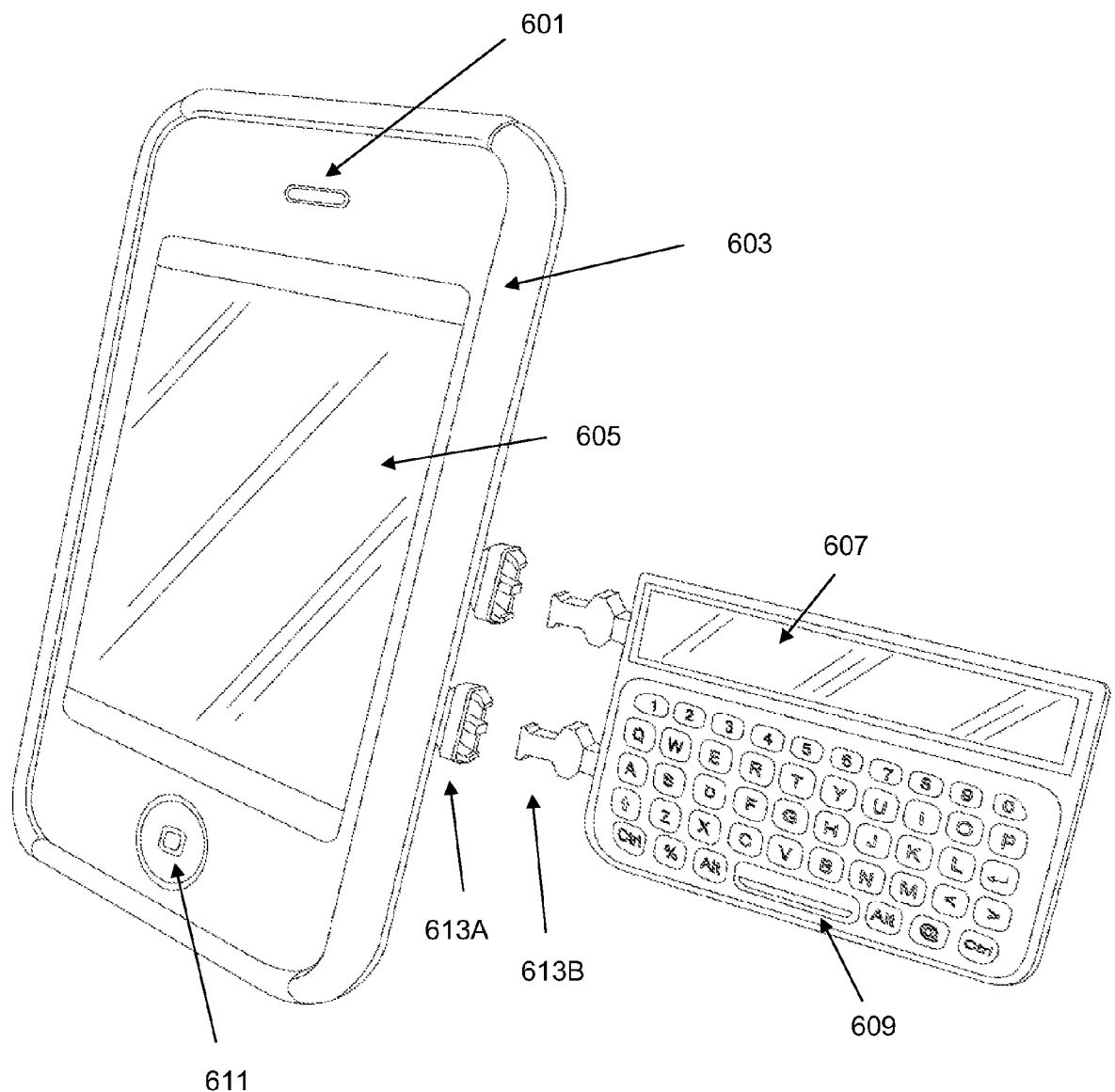
FIG. 6 shows a front surface of a removable portable electronics cover with a physical keyboard and a text/graphic readout display unit separated from the removable portable electronics cover with a keyboard/display connector port, in accordance with an embodiment of the invention.

Moreover, if the physical keyboard (509) and the text/graphic readout display unit (507) are separated from the keyboard/display connector port (513), as shown in FIG. 6, then a user can still enter text information and other relevant data to the physical keyboard (509), which in turn communicates with the portable electronic device wirelessly. Examples of wireless communication protocols used for sharing text information and other relevant data between the physical keyboard (509) and the portable electronic device include Bluetooth and IEEE 802.11-based Wi-Fi protocols. These wireless communication protocols may also incorporate commonly-known security features such as a wireless encryption protocol (WEP) and a secure authentication to provide data security for at least some information communicated between the physical keyboard (509) and the portable electronic device.

FIG. 6 shows a front surface of a removable portable electronics cover (600) with a physical keyboard (609) and a text/graphic readout display unit (607) separated from the removable portable electronics cover (600) with keyboard/display connector ports (613A, 613B), in accordance with an embodiment of the invention. This embodiment of the invention shows a removable cover frame (603) surrounding, encapsulating, and/or covering a portion of an outer shell of a portable electronic device. The removable cover frame (603) is typically an aftermarket skin cover for an outer shell of a portable electronic device, wherein the removable cover frame (603) also incorporates a detachable physical keyboard (609) and a detachable text/graphic readout display unit (607). Furthermore, in one embodiment of the invention, a portable device at least partially surrounded, encapsulated, and/or covered by the removable cover frame (603) has an earpiece (601), a touch-screen interface (605), and a hardware-based button (611) which are exposed to an exterior shell of the portable device.

In one example of an embodiment as shown by FIG. 6, the keyboard/display connector ports (613A, 613B) enable a physical docking and a separation of a physical keyboard (609) and/or a text/graphic readout display unit (607). When the physical keyboard (609) and/or the text graphic readout display unit (607) are docked to the keyboard/display connector port (513), the removable cover frame (603) and/or a portable electronic device inside the removable cover frame (603) may be able to recharge a battery contained by the physical keyboard (609) and/or the text/graphic readout display unit (607). Furthermore, the physical keyboard (609) and the text/graphic readout display unit (607) docked to a removable cover frame side (613A) of the keyboard/display connector ports (613A, 613B) may still enable data entry operations to a user either via a wired or a wireless communication with a portable electronic device at least partially surrounded, encapsulated, and/or covered by the removable cover frame (603), even as the battery contained by the physical keyboard (609) and/or the text/graphic readout display unit (607) is charging. In a preferred embodiment of the invention, the text/graphic readout display unit (607) is capable of displaying at least some visual information to allow a user to see what he/she is typing into the physical keyboard (609).

Moreover, if the physical keyboard (609) and the text/graphic readout display unit (607) are separated from the removable cover frame side (613A) of the keyboard/display connector ports (613A, 613B), as shown in FIG. 6, then a user can still enter text information and other relevant data to the physical keyboard (609), which in turn communicates with the portable electronic device wirelessly. Examples of wireless communication protocols used for sharing text information and other relevant data between the physical keyboard (609) and the portable electronic device include Bluetooth and IEEE 802.11-based Wi-Fi protocols. These wireless communication protocols may also incorporate commonly-known security features such as a wireless encryption protocol (WEP) and a secure authentication to provide data security for at least some information communicated between the physical keyboard (609) and the portable electronic device.

Figure 7:
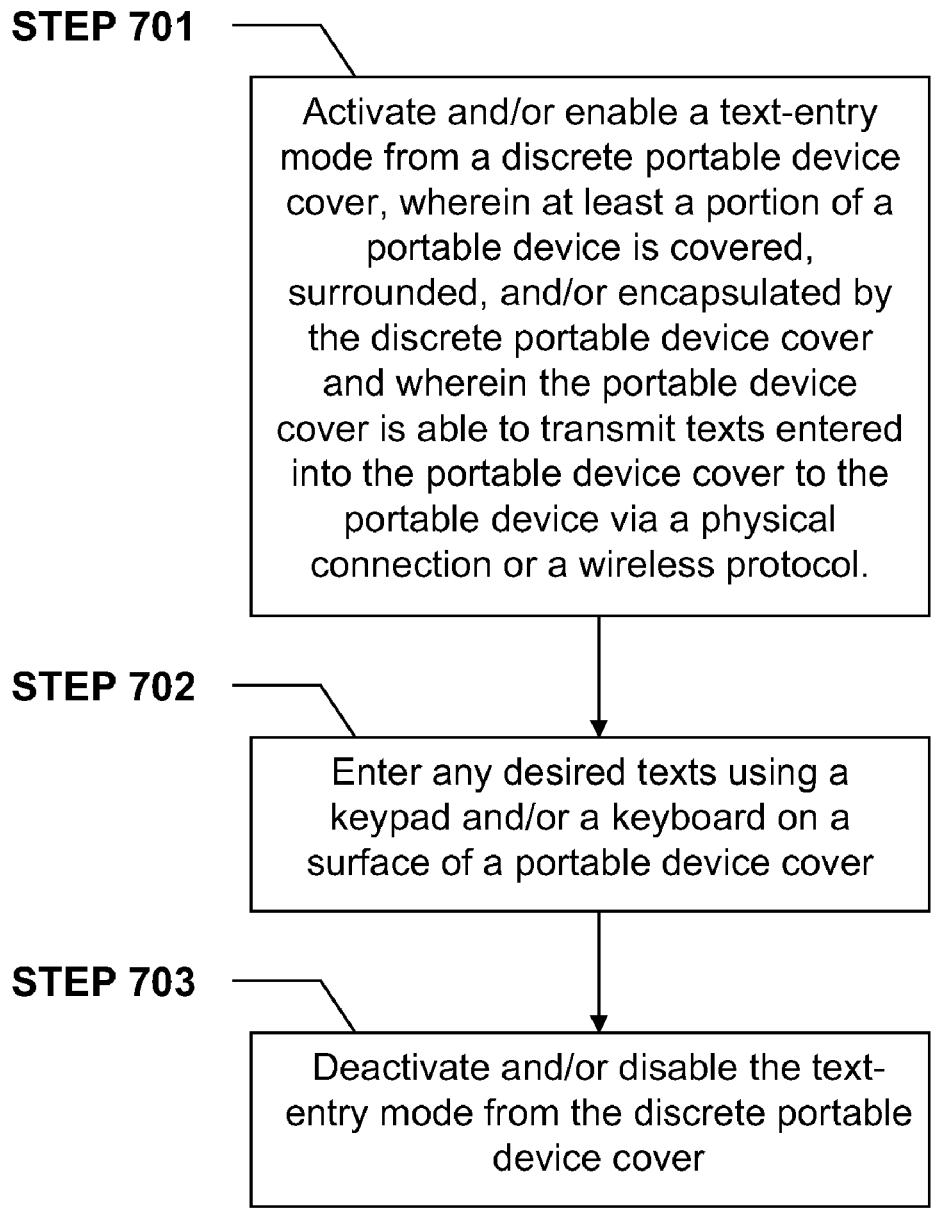
FIG. 7 shows a method for using a removable portable device cover with a physical keyboard and a text/graphic readout display unit in accordance with an embodiment of the invention.

FIG. 7 shows a method (700) for using a removable portable device cover with a physical keyboard and a text/graphic readout display unit in accordance with an embodiment of the invention. In one embodiment of the invention as shown in STEP 701, a user can activate and/or enable a text-entry mode from a discrete removable portable device cover. In the preferred embodiment of the invention, the discrete removable portable device cover surrounds, encapsulates, or covers at least a portion of an exterior shell of a portable electronic device. Furthermore, in the preferred embodiment of the invention, the discrete removable portable device cover is capable of transmitting texts entered into a keyboard of the discrete removable portable device cover to the portable electronic device via a physical connection or a wireless protocol. Then, in STEP 702, the user can enter any desired texts using a keypad and/or a keyboard on a surface of a discrete removable portable device cover. Furthermore, the keypad and/or the keyboard may also contain an additional user input mechanism, such as a joystick, a track-point, or a mouse. Lastly, in STEP 703, the user can deactivate and/or disable the text-entry mode from the discrete removable portable device cover. A user's ability to deactivate and/or disable the text-entry mode from the discrete removable portable device cover minimizes chances of accidental or unwanted data entry when the user is not using the keypad and/or the keyboard.

FIG. 8 shows a front surface of a removable portable device cover (800) with a physical keyboard (819) and a text/graphic readout display unit (803) folded out from a top portion or a bottom portion of the removable portable electronics cover (800) with detachable straps (801, 809), in accordance with an embodiment of the invention. In this embodiment of the invention, a physical keyboard (819) is operatively attached to a portion of a removable cover frame (821) via a cover-to-keyboard strap (817) in a "landscape" configuration, which typically allows a keyboard size to be bigger for user's ergonomic convenience during typing, compared to a "portrait" configuration of FIG. 1. Optionally, a text/graphics readout display unit (803) is also operatively attached to a portion of the removable cover frame (821) via a cover-to-display strap (805). In the preferred embodiment of the invention, the cover-to-display strap (805) and/or the cover-to-keyboard strap (817) may contain electrical and/or optical connections to the text/graphics readout display unit (803) and/or the physical keyboard (819).

Furthermore, in one embodiment of the invention, the first one or more detachable straps (801) can be attached or detached to second one or more detachable straps (809), if the physical keyboard (819) and/or the text/graphic readout display unit (803) are "swung back" to a "strapped-on" position as shown in FIG. 9. In a preferred embodiment of the invention, the first one or more detachable straps (801) and the second one or more detachable straps (809) are Velcro strips of opposite gender to accommodate repetitive attachment and detachment of both detachable straps (801, 809). In addition, in one embodiment of the invention, the physical keyboard (819) and/or the text/graphic readout display unit (803) can be separately powered by a battery or another power source independent of a portable electronic device which is designed to fit into the removable portable device cover (800). In another embodiment of the invention, the physical keyboard (819) and/or the text/graphic readout display unit (803) may be powered by the portable electronic device through an electrical connection.

In a "fold-out" position as shown in FIG. 8, a user can type on the physical keyboard (819) and check at least some textual and/or graphical information relevant to his/her data entry on the text/graphics readout display unit (803), regardless of a current state or a current position of a device display on a portable electronic device. In the "fold-out" position, the user may also utilize a main device display on a front surface of a portable electronic device as well as the text/graphics readout display unit (803) on the removable portable device cover (800) for a dual-display use. A user may find typing in the "fold-out" position particularly convenient if a task requires watching the main device display on the front surface of a portable electronic device as he/she types on the physical keyboard (819) attached to a removable portable device cover (800). In the "fold-out" position, the user may get an additional benefit of checking for any typos on a separate text/graphic readout display (803) attached to the removable portable device cover (800) even as he/she also watches the main device display of the portable electronic device.

Moreover, the physical keyboard (819) and/or the text/graphic readout display unit (803) are configured to share (i.e. transmit and/or receive) at least some textual information with the portable electronic device designed to fit into the removable portable device cover (800). In a preferred embodiment of the invention, textual information can be shared among the physical keyboard (819), the text/graphic readout display unit (803), and the portable electronic device using electrical wire connections. In another embodiment of the invention, the textual information can be shared among the physical keyboard (819), the text/graphic readout display unit (803), and the portable electronic device using purely wireless protocols such as Bluetooth. Yet in another embodiment of the invention, the textual information can be shared among the physical keyboard (819), the text/graphic readout display unit (803), and the portable electronic device by using a combination of wired and wireless methods well known in the art.

Continuing with FIG. 8, in one embodiment of the invention, the removable portable device cover (800) has a removable cover frame (821) which accommodates a rear wall (815) and a plurality of auxiliary connection openings such as a camera lens hole (813), a first cover opening for external connection (811), and a second cover opening for external connection (807). Examples of external connections through cover openings include data and/or power outlet connections for a portable device designed to be placed inside the removable portable device cover. Although the rear wall (815) and the plurality of auxiliary connection openings (e.g. 811, 807, 813) may be desired in some embodiments, incorporations of these particular elements are merely optional for the present invention. In certain cases, the rear wall (815) may be utilized to provide a structural rigidity to the physical keyboard (819) in a "strapped-on" position as shown in FIG. 9.

FIG. 9 shows a rear surface of a removable portable device cover (900) with a physical keyboard (909) and a text/graphic readout display unit (903) attached to a rear wall (915) of the removable portable device cover (900) with detachable straps (913) in a "strapped-on" position, in accordance with an embodiment of the invention. In the "strapped-on" position as shown in FIG. 9, the physical keyboard (909) and the text/graphic readout display unit (903) are strapped to the rear wall (915) by overlapping at least some portions of first one or more detachable straps (e.g. 801) with second one or more detachable straps (e.g. 809). In a preferred embodiment of the invention, the detachable straps (913) are Velcro strips of opposite gender, which enable repetitive attachment and detachment of the first one or more detachable straps (e.g. 801) and the second one or more detachable straps (e.g. 809). A cover-to-display strap (905) and/or a cover-to-keyboard strap (907) may contain electrical and/or optical connections to the text/graphics readout display unit (903) and/or the physical keyboard (909).

In the "strapped-on" position as shown in FIG. 9, a user can type on the physical keyboard (909) and check at least some textual and/or graphical information relevant to his/her data entry on the text/graphics readout display unit (903), regardless of a current state or a current position of a device display on a portable electronic device. A user may find typing in the "strapped-on" position particularly convenient if a significant amount of typing is desired on a physical keyboard. Furthermore, the user also may find typing in the "strapped-on" position more convenient because of a larger-size keyboard on a rear surface of an aftermarket device cover as a substitute for a typically-cramped keyboard on a front surface of a portable device itself. The "landscape" orientation of a physical keyboard (819, 909) in FIGS. 8~9 is particularly ergonomic to a user who prefers a larger size physical keyboard for convenient typing.

Continuing with FIG. 9, the physical keyboard (909) and/or the text/graphic readout display unit (903) are configured to share (i.e. transmit and/or receive) at least some textual information with the portable electronic device designed to fit into the removable portable device cover (900). In a preferred embodiment of the invention, textual information can be shared among the physical keyboard (909), the text/graphic readout display unit (903), and the portable electronic device using electrical wire connections. In another embodiment of the invention, the textual information can be shared among the physical keyboard (909), the text/graphic readout display unit (903), and the portable electronic device using purely wireless protocols such as Bluetooth. Yet in another embodiment of the invention, the textual information can be shared among the physical keyboard (909), the text/graphic readout display unit (903), and the portable electronic device by using a combination of wired and wireless methods well known in the art.

Continuing with FIG. 9, in one embodiment of the invention, the removable portable device cover (900) has a removable cover frame (915) which accommodates a rear wall (e.g. 815), a first cover opening for external connection (911), and a second cover opening for external connection (901). Examples of external connections through cover openings include data and/or power outlet connections for a portable device designed to be placed inside the removable portable device cover. Although the rear wall (e.g. 815) and a plurality of auxiliary connection openings (e.g. 911, 901) may be desired in some embodiments, incorporations of these particular elements are merely optional for the present invention. In certain cases, the rear wall (e.g. 815) may be utilized to provide a structural rigidity to the rear panel of the physical keyboard (909) in a "strapped-on" position as shown in FIG. 9.

Figure 10:
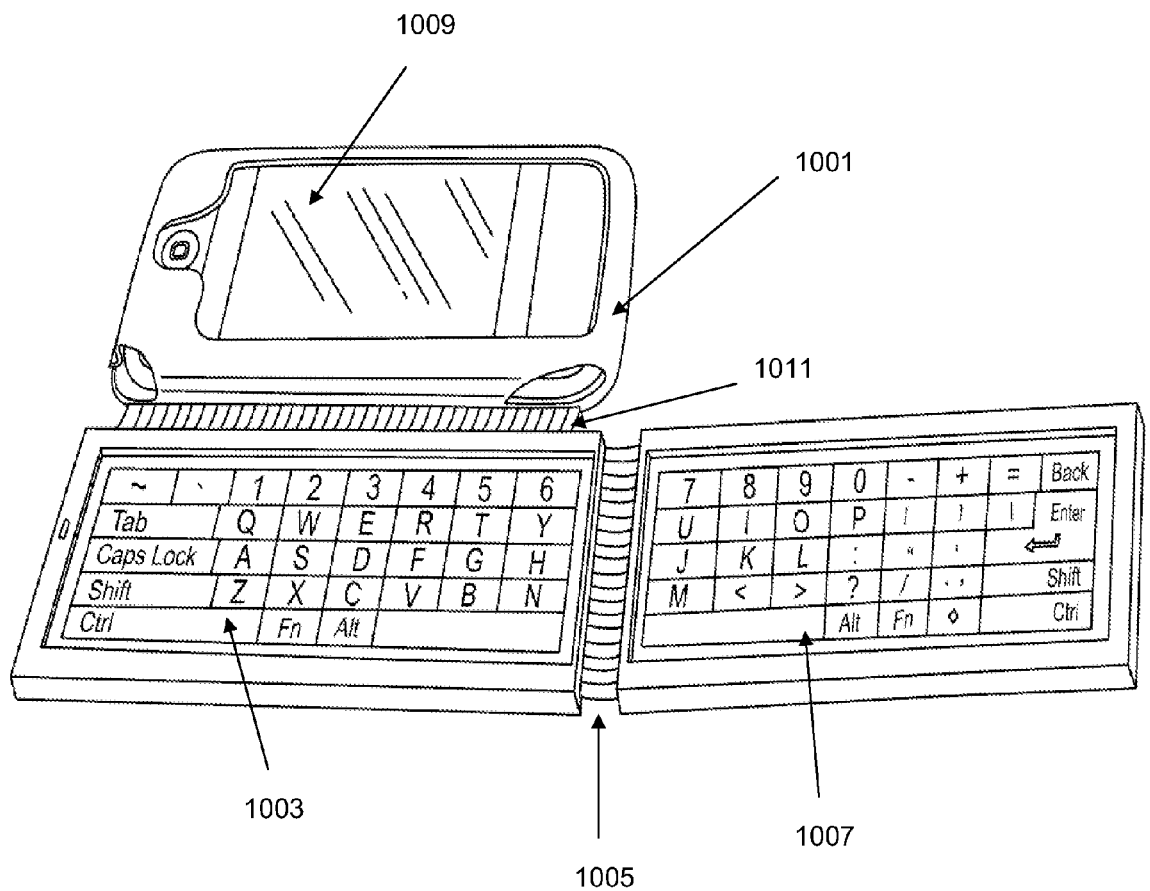
FIG. 10 shows a fully-expanded view of a foldable keyboard operatively connected to a removable cover frame of a removable portable device cover, in accordance with an embodiment of the invention.

FIG. 10 shows a fully-expanded view of a removable portable device cover (1000) with a foldable physical keyboard (1003, 1007) operatively connected to a removable cover frame (1001), in accordance with an embodiment of the invention. In a preferred embodiment of the invention, the foldable physical keyboard (1003, 1007) comprises a first piece (1003) of keyboard elements and a second piece (1007) of keyboard elements, wherein the first piece (1003) and the second piece (1007) are typically operatively connected by a first flexible electrical connector (1005). Furthermore, in the preferred embodiment of the invention, the first piece (1003) and the removable cover frame (1001) are typically operatively connected by a second flexible electrical connector (1011). One example of a first (1005) and/or a second (1011) flexible electrical connector is a flexible printed circuit board (flexible PCB). Another example of the first (1005) and/or the second (1011) flexible electrical connector is a flexible wire or a flexible tape with an embedded electrical connection. In another embodiment of the invention, the first piece (1003) and the second piece (1007) of keyboard elements do not necessarily use the first (1005) and/or the second (1011) flexible electrical connectors and are capable of communicating with a portable electronic device (1009) with a different connection configuration from FIG. 10. One example of a different connection configuration from FIG. 10 is one or more wireless connections (e.g. Bluetooth, IEEE 802.11-derived Wi-LAN's, and etc.) among the first piece (1003), the second piece (1007), the removable cover frame (1001), and/or the portable electronic device (1009). The one or more wireless connections in a different connection configuration from FIG. 10 may also be combined with one or more physical wire connections among the first piece (1003), the second piece (1007), the removable cover frame (1001), and/or the portable electronic device (1009).

In the preferred embodiment of the invention, the first piece (1003) contains a left-half of a "QWERTY" keyboard and the second piece (1007) contains a right-half of the "QWERTY" keyboard. Furthermore, the foldable physical keyboard (1003, 1007) is capable of transferring or receiving user input data and other relevant data with a portable electronic device (1009) which fits into the removable cover frame (1001). One advantage of the foldable physical keyboard configuration as shown in FIG. 10 is an extensive size of the foldable physical keyboard in a fully-expanded position, which allows an easy touch-typing by a user. Another advantage of this foldable physical keyboard configuration is that the foldable physical keyboard (1003, 1007) can be neatly folded into a one-piece cover (e.g. 1203, 1207 of FIG. 12) as part of an aftermarket removable portable device cover (1000 of FIG. 10, 1100 of FIG. 11, 1200 of FIG. 12) for a portable electronic device (e.g. 1009), thereby allowing a user to conveniently carry an expandable keyboard for portable touch-typing with any portable electronic device (e.g. 1009) which fits into the removable cover frame (1001).

Furthermore, the foldable physical keyboard configuration as shown in FIG. 10 allow a display screen of the portable electronic device (e.g. 1009) to function as a convenient type readout screen in a "landscape" aspect ratio as a user is touch-typing into the foldable physical keyboard. However, the foldable physical keyboard configuration for a removable portable device cover (100) is not limited to an L-shape as shown in FIG. 10 and may include a variety of different folding shapes. For example, in one embodiment of the invention, a folding physical keyboard configuration may attach a removable cover frame (e.g. 1001) on a left side or a right side of the foldable keyboard (1003, 1007) to form a line-shape configuration, instead of on top of the first piece (1003) as illustrated in FIG. 10 as a preferred embodiment.

Figure 11:
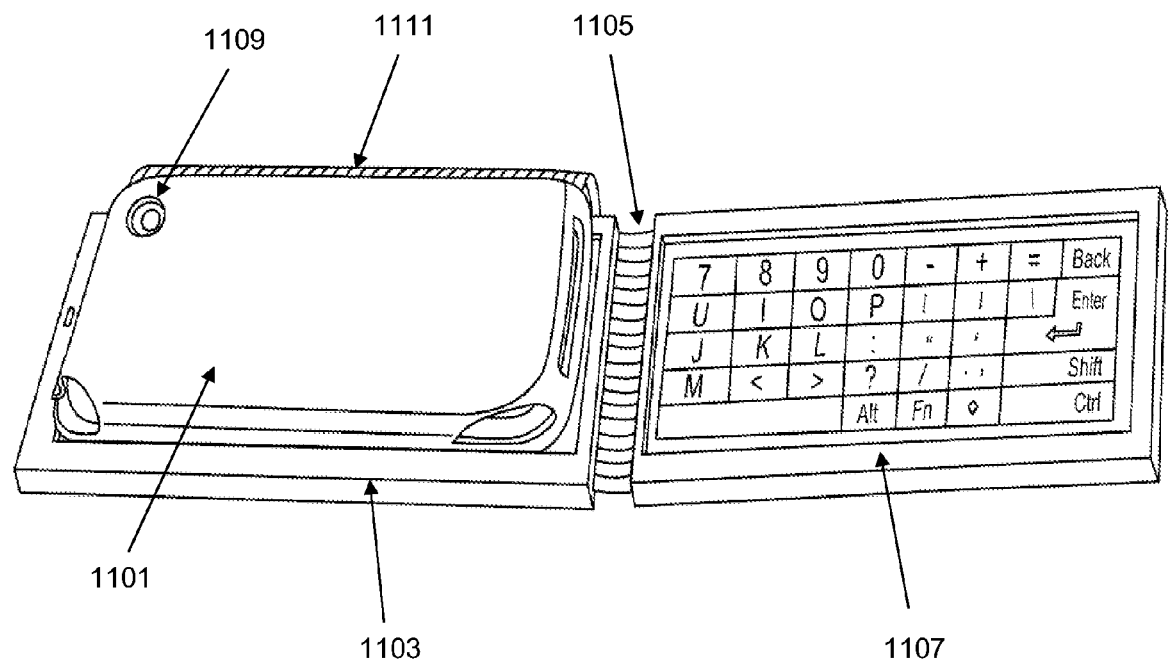
FIG. 11 shows a partially-folded view of a foldable keyboard operatively connected to a removable cover frame of a removable portable device cover, in accordance with an embodiment of the invention.

FIG. 11 shows a partially-folded view of a foldable keyboard (1103, 1107) operatively connected to a removable cover frame (1101) of a removable portable device cover (1100), in accordance with an embodiment of the invention. In one embodiment of the invention, the removable cover frame (1101) has a camera lens hole (1109) as shown in FIG. 11. In a preferred embodiment of the invention, the foldable physical keyboard (1103, 1107) comprises a first piece (1103) of keyboard elements and a second piece (1107) of keyboard elements, wherein the first piece (1103) and the second piece (1107) are operatively connected by a first flexible electrical connector (1105). Furthermore, in the preferred embodiment of the invention, the removable cover frame (1101) is operatively connected to the first piece (1103) of keyboard elements by a second flexible electrical connector (1111). One example of a first (1105) and/or a second (1111) flexible electrical connector is a flexible printed circuit board (flexible PCB). Another example of the first (1105) and/or the second (1111) flexible electrical connector is a flexible wire or a flexible tape with an embedded electrical connection. In another embodiment of the invention, the first piece (1103) and the second piece (1107) of keyboard elements do not necessarily use the first (1105) and/or the second (1111) flexible electrical connectors and are capable of communicating with a portable electronic device with a different connection configuration from FIG. 11. One example of a different connection configuration from FIG. 11 is one or more wireless connections (e.g. Bluetooth, IEEE 802.11-derived Wi-LAN's, and etc.) among the first piece (1103), the second piece (1107), the removable cover frame (1101), and/or the portable electronic device. The one or more wireless connections in a different connection configuration from FIG. 11 may also be combined with one or more physical wire connections among the first piece (1103), the second piece (1107), the removable cover frame (1101), and/or the portable electronic device.

Figure 12:
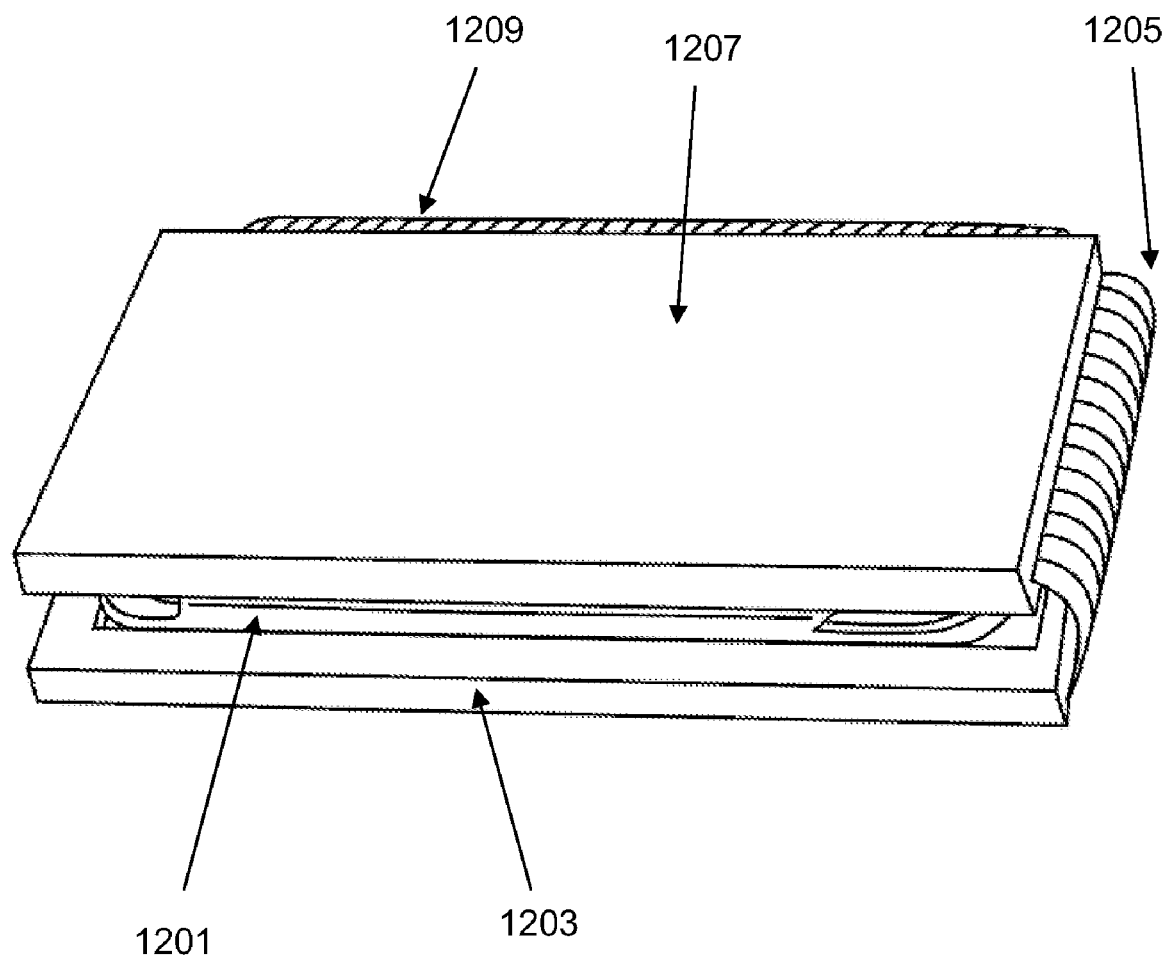
FIG. 12 shows a completely-folded view of a foldable keyboard operatively connected to a removable cover frame of a removable portable device cover, in accordance with an embodiment of the invention.

In an embodiment of the invention as shown in FIG. 11, the removable cover frame (1101), which is at least partially covering, surrounding, and/or encapsulating a portable electronic device inside, is folded on top of the first piece (1103). Then, as shown in FIG. 12, the second piece (1107) can be folded on top of a rear surface of the removable cover frame (1101). Once both the first piece (1103) and the second piece (1107) of keyboard elements are folded, the folded keyboard (1103, 1107) can function as an exterior aftermarket top and bottom covers for a removable cover frame (1101) which is configured to fit a portable electronic device. In another embodiment of the invention, a foldable keyboard can comprise multiple pieces beyond the two-piece configuration shown in FIG. 10 and FIG. 11. Yet in another embodiment of the invention, a foldable keyboard can fold itself first before getting folded to a top surface or a bottom surface of a removable cover frame. The folded physical keyboard (1103, 1107) as part of the removable portable device cover (1100) allows a user to conveniently carry an expandable keyboard for portable touch-typing with any portable electronic device which fits into the removable cover frame (1101).

FIG. 12 shows a completely-folded view of a foldable keyboard (1203, 1207) operatively connected to a removable cover frame (1201) of a removable portable device cover (1200), in accordance with an embodiment of the invention. In a preferred embodiment of the invention, the foldable physical keyboard (1203, 1207) comprises a first piece (1203) of keyboard elements and a second piece (1207) of keyboard elements, wherein the first piece (1203) and the second piece (1207) are operatively connected by a first flexible electrical connector (1205). Furthermore, in the preferred embodiment of the invention, the removable cover frame (1201) is operatively connected to the first piece (1203) of keyboard elements by a second flexible electrical connector (1209). One example of a first (1205) and/or a second (1209) flexible electrical connector is a flexible printed circuit board (flexible PCB). Another example of the first (1205) and/or the second (1209) flexible electrical connector is a flexible wire or a flexible tape with an embedded electrical connection.

In an embodiment of the invention as shown in FIG. 12, the removable cover frame (1201), which is at least partially covering, surrounding, and/or encapsulating a portable electronic device inside, is folded on top of the first piece (1203). Then, as shown in FIG. 12, the second piece (1207) can be folded on top of a rear surface of the removable cover frame (1201). Once both the first piece (1203) and the second piece (1207) of keyboard elements are folded, the folded keyboard (1203, 1207) can function as an exterior aftermarket top and bottom covers for a removable cover frame (1201) which is configured to fit a portable electronic device. In another embodiment of the invention, a foldable keyboard can comprise multiple pieces beyond the two-piece configuration shown in FIG. 10~12. Yet in another embodiment of the invention, a foldable keyboard can fold itself first before getting folded to a top surface or a bottom surface of a removable cover frame. The folded physical keyboard (1203, 1207) as part of the removable portable device cover (1200) allows a user to conveniently carry an expandable keyboard for portable touch-typing with any portable electronic device which fits into the removable cover frame (1201).

One or more apparatuses and methods for data entry from a removable portable device cover have been disclosed. The present invention exhibits several advantages over conventional apparatuses and methods of data entry into a portable electronic device. First, by integrating a physical keyboard interface as part of a removable portable device cover, the present invention provides a large-surface keyboard for touch-typing which can be conveniently carried with a portable electronic device whenever a user is covering a portable electronic device with an embodiment of the present invention. Second, by incorporating a strap-on and fold-out design (FIGS. 1~3, FIGS. 8~9), an embedded rear surface design (FIG. 4), a wireless port design (FIG. 5~6), and a foldable-keyboard design (FIGS. 10~12) as various embodiments of the invention, the present invention discloses a variety of convenient and portable extra keyboard interfaces which can be carried as removable portable device covers.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for data entry from a removable portable device cover, the apparatus comprising:
    a removable cover frame configured to cover, surround, and/or encapsulate at least a portion of an exterior shell of a portable electronic device;
    a physical keyboard operatively connected to the removable cover frame via a cover-to-keyboard strap;
    a first detachable strap attached to the physical keyboard; and
    a second detachable strap and a third detachable strap both pivotally attached to and extending from a body of the removable cover frame, wherein the first detachable strap and the pivotally-attached second detachable strap and the pivotally-attached third detachable strap are configured to form a strapped-on position for the physical keyboard on a rear surface of the removable device cover by providing a detachable adhesion upon contact, and wherein the pivotally-attached second detachable strap and the pivotally-attached third detachable strap provides an adjustable tightness for the strapped-on position for the physical keyboard on the rear surface of the removable portable device cover.

2. The apparatus of claim 1, further comprising a text/graphic readout display operatively connected to the removable cover frame via a cover-to-display strap.

3. The apparatus of claim 2, wherein the text/graphic readout display is a liquid crystal display (LCD) or an organic light emitting diode (OLED).

4. The apparatus of claim 2, wherein the text/graphic readout display is configured to display at least some text information typed by a user on the physical keyboard.

5. The apparatus of claim 1, wherein the first detachable strap contains a Velcro surface of first gender and the second detachable strap and the third detachable strap contains a Velcro surface of an opposite gender from the first gender.

6. The apparatus of claim 1, further comprising a rear wall attached to the removable cover frame, wherein the rear wall covers at least a portion of a rear surface area of the removable cover frame and wherein the rear wall provides a surface to which the physical keyboard can be positioned firmly.

7. The apparatus of claim 2, wherein the cover-to-display strap and/or the cover-to-keyboard strap contains electrical and/or optical wires.

8. The apparatus of claim 1, wherein the physical keyboard is configured to communicate with the portable electronic device to share at least some textual information.

9. The apparatus of claim 1, further comprising a camera lens hole, a first cover opening for external connection, and/or a second cover opening for external connection.

10. An apparatus for data entry from a removable portable device cover, the apparatus comprising:
- a removable cover frame configured to cover, surround, and/or encapsulate at least a portion of an exterior shell of a portable electronic device, wherein a rear surface of the removable cover frame includes an open rear space and a rear wall;
- a physical keyboard and a text/graphic readout display operatively connected to the removable cover frame;
- a first detachable strap attached to the physical keyboard; and
- a second detachable strap and a third detachable strap both pivotally attached to and extending from a body of the removable cover frame, wherein the first detachable strap and the pivotally-attached second detachable strap and the pivotally-attached third detachable strap are configured to form a strapped-on position for the physical keyboard on the rear wall of the removable device cover by providing a detachable adhesion upon contact, and wherein the pivotally-attached second detachable strap and the pivotally-attached third detachable strap provides an adjustable tightness for the strapped-on position for the physical keyboard on the rear wall of the removable portable device cover.

11. The apparatus of claim 10, further comprising a first cover opening and/or a second cover opening for external connection of the portable electronic device.

12. The apparatus of claim 10, further comprising a camera lens hole.

13. The apparatus of claim 10, wherein the text/graphic readout display is a liquid crystal display (LCD) or an organic light emitting diode (OLED).

14. The apparatus of claim 10, wherein the text/graphic readout display is configured to display at least some text information typed by a user on the physical keyboard.

15. The apparatus of claim 10, wherein the physical keyboard is configured to communicate with the portable electronic device to share at least some textual information.

* * * * *